(12) United States Patent
Wang et al.

(10) Patent No.: US 11,264,592 B2
(45) Date of Patent: Mar. 1, 2022

(54) ENCAPSULATION STRUCTURE AND ENCAPSULATION METHOD OF ELECTROLUMINESCENT DEVICE, DISPLAY PANEL

(71) Applicant: BOE TECHNOLOGY GROUP CO., LTD., Beijing (CN)

(72) Inventors: Dan Wang, Beijing (CN); Rui Hong, Beijing (CN); Lei Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 119 days.

(21) Appl. No.: 16/475,714

(22) PCT Filed: Jan. 10, 2019

(86) PCT No.: PCT/CN2019/071189
§ 371 (c)(1),
(2) Date: Jul. 3, 2019

(87) PCT Pub. No.: WO2019/227941
PCT Pub. Date: Dec. 5, 2019

(65) Prior Publication Data
US 2020/0358029 A1   Nov. 12, 2020

(30) Foreign Application Priority Data

May 29, 2018   (CN) .......................... 201810529950.1

(51) Int. Cl.
*H01L 51/52*   (2006.01)
*H01L 51/56*   (2006.01)

(52) U.S. Cl.
CPC ........ *H01L 51/5253* (2013.01); *H01L 51/524* (2013.01); *H01L 51/56* (2013.01); *H01L 2251/301* (2013.01)

(58) Field of Classification Search
CPC ............. H01L 51/5237; H01L 51/5253; H01L 51/524; H01L 51/56; H01L 2251/301; H01L 2251/5369
See application file for complete search history.

(56) References Cited

U.S. PATENT DOCUMENTS 9,412,971 B2    8/2016 Reusch
2007/0182314 A1*   8/2007 Oh ..................... H01L 51/5256
                                                     313/500
(Continued)

FOREIGN PATENT DOCUMENTS

CN       103718324 A      4/2014
CN       106229420 A     12/2016
(Continued)

OTHER PUBLICATIONS

Machine Translation of Hagihara (WO 2015/147096 A1) (Oct. 1, 2015) (Year: 2015).*

(Continued)

*Primary Examiner* — Caridad Everhart
(74) *Attorney, Agent, or Firm* — Collard & Roe, P.C.

(57) ABSTRACT

An encapsulation structure of an organic electroluminescent device includes a substrate, a first inorganic sealing layer and an organic sealing layer. The first inorganic sealing layer is stacked on the substrate, and the organic sealing layer is stacked on a side of the first inorganic sealing layer that is away from the substrate. The organic sealing layer includes a UV light absorbing material and/or a UV resistant polymer material. An encapsulation method of the encapsulation structure of an organic electroluminescent device and a display panel including the encapsulation structure are further provided.

7 Claims, 2 Drawing Sheets

(56) References Cited

U.S. PATENT DOCUMENTS

| | | | |
|---|---|---|---|
| 2010/0194717 A1* | 8/2010 | Mori | H01L 51/5268 345/204 |
| 2010/0225229 A1* | 9/2010 | Hosoda | H01L 51/5268 313/504 |
| 2011/0132449 A1* | 6/2011 | Ramadas | H01L 51/56 136/256 |
| 2013/0235515 A1* | 9/2013 | Ouderkirk | G02F 1/1333 361/679.01 |
| 2014/0179040 A1 | 6/2014 | Ramadas et al. | |
| 2017/0306194 A1* | 10/2017 | Kwak | B32B 27/08 |
| 2018/0009775 A1* | 1/2018 | Tanaka | G03F 7/0046 |

FOREIGN PATENT DOCUMENTS

| | | | |
|---|---|---|---|
| CN | 106450026 A | 2/2017 | |
| CN | 108598285 A | 9/2018 | |
| WO | WO2015147096 A1 * | 10/2015 | H01L 51/5253 |

OTHER PUBLICATIONS

Abstract of CN 107726235 A (Jiao, R.) (Feb. 23, 2018). (Year: 2018).*

* cited by examiner

US 11,264,592 B2

ENCAPSULATION STRUCTURE AND ENCAPSULATION METHOD OF ELECTROLUMINESCENT DEVICE, DISPLAY PANEL

CROSS REFERENCE TO RELATED APPLICATIONS

This application is the National Stage of PCT/CN2019/071189 filed on Jan. 10, 2019, which claims priority under 35 U.S.C. § 119 of Chinese Application No. 201810529950.1 filed on May 29, 2018, the disclosure of which is incorporated by reference.

TECHNICAL FIELD

Embodiments of the present disclosure relate to an encapsulation structure of an organic electroluminescent device, an encapsulation method of an organic electroluminescent device, and a display panel.

BACKGROUND

In recent years, organic electroluminescent displays (OLEDs) have received more and more attention as a new type of flat panel display. Because of their characteristics such as active illumination, high luminance, high resolution, wide viewing angle, fast response, low power consumption, flexibility and so on, the organic electroluminescent displays may substitute for liquid crystal displays as a next-generation display technology. However, because an OLED device has organic layer materials that are extremely sensitive to moisture and oxygen, the lifetime of the OLED device is greatly reduced. Moreover, because the OLED panel is used in the external sunlight environment for a long time, there is a risk of material denaturation caused by the irradiation of ultraviolet rays in the sunlight, which is unfavorable for the lifetime of the OLED device.

SUMMARY

At least one embodiment of the present disclosure provides an encapsulation structure of an organic electroluminescent device, which comprises: a substrate; a first inorganic sealing layer stacked on the substrate; and an organic sealing layer stacked on the first inorganic sealing layer and on a side of the first inorganic sealing layer that is away from the substrate, wherein the organic sealing layer comprises a UV light absorbing material and/or a UV resistant polymer material.

In an embodiment of the present disclosure, the UV light absorbing material comprises at least one of a titan yellow pigment, a quinophthalone pigment, and a pyrazolone pigment.

In an embodiment of the present disclosure, the UV light absorbing material has a particle diameter d which satisfies 80 nm≤d≤400 nm.

In an embodiment of the present disclosure, the UV resistant polymer material comprises an acrylate prepolymer, a UV reactive monomer, a photoinitiator, a leveling agent, an ultraviolet absorber, and an organic solvent.

In an embodiment of the present disclosure, the encapsulation structure of an organic electroluminescent device further comprises a second inorganic sealing layer, and the second inorganic sealing layer is stacked on the organic sealing layer and on a side of the organic sealing layer that is away from the substrate.

At least one embodiment of the present disclosure provides an encapsulation method of an organic electroluminescent device, comprising: preparing a substrate; forming a first inorganic sealing layer on the substrate; and forming an organic sealing layer on the first inorganic sealing layer, wherein the organic sealing layer is made of an organic material comprising a UV light absorbing material and/or a UV resistant polymer material.

In an embodiment of the present disclosure, in case the organic material comprises the UV light absorbing material, the forming the organic sealing layer on the first inorganic sealing layer comprises: forming the organic sealing layer on the first inorganic sealing layer by an inkjet printing technique.

In an embodiment of the present disclosure, in case the organic material comprises the UV resistant polymer material, the forming the organic sealing layer on the first inorganic sealing layer comprises: forming the organic sealing layer on the first inorganic sealing layer by an inkjet printing technique; and allowing the UV resistant polymer material to form a crosslinked UV resistant structure.

In an embodiment of the present disclosure, the UV resistant polymer material is allowed to form the crosslinked UV resistant structure by heating or UV irradiation.

In an embodiment of the present disclosure, the UV light absorbing material comprises at least one of a titan yellow pigment, a quinophthalone pigment, and a pyrazolone pigment.

In an embodiment of the present disclosure, the UV light absorbing material has a particle diameter d which satisfies 80 nm≤d≤400 nm.

In an embodiment of the present disclosure, the UV resistant polymer material comprises an acrylate prepolymer, a UV reactive monomer, a photoinitiator, a leveling agent, an ultraviolet absorber, and an organic solvent.

In an embodiment of the present disclosure, the encapsulation method of the organic electroluminescent device further comprises: forming a second inorganic sealing layer on the organic sealing layer.

In an embodiment of the present disclosure, the preparing the substrate comprises: providing a TFT pixel circuit on the substrate; and depositing functional layers of the organic electroluminescent device sequentially on the substrate provided with the TFT pixel circuit.

At least one embodiment of the present disclosure provides a display panel, which comprises the above encapsulation structure of an organic electroluminescent device.

At least one embodiment of the present disclosure provides a display panel, which comprises an encapsulation structure of an organic electroluminescent device, wherein the encapsulation structure is formed by the above encapsulation method.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and are not intended to limit the present disclosure.

Figure 1:
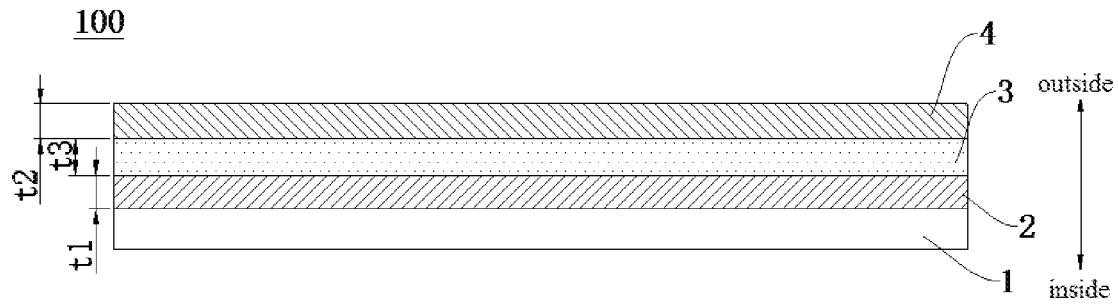
FIG. 1 is a partial sectional view of an encapsulation structure of an organic electroluminescent device provided by an embodiment of the present disclosure.

REFERENCE NUMERALS encapsulation structure 100, substrate 1, first inorganic sealing layer 2, organic sealing layer 3, and second inorganic sealing layer 4.

DETAILED DESCRIPTION

In order to make objects, technical solutions and advantages of the embodiments of the disclosure apparent, the technical solutions of the embodiments will be described in a clearly and fully understandable way in connection with the drawings related to the embodiments of the disclosure. It is apparent that the described embodiments are just a part but not all of the embodiments of the disclosure. Based on the described embodiments, those skilled in the art may obtain other embodiments, without any creative work, which shall be within the scope of the disclosure.

In the descriptions of the present disclosure, it is understood that the terms "upper", "lower", "front", "back", "left", "right", "vertical", "horizontal", "top", "bottom", "inside", "outside", and so on indicate orientation or positional relationship based on the orientation or positional relationship shown in the drawings, and are merely for the convenience of describing the present disclosure and simplifying the descriptions. The terms do not indicate or imply that the device or component described has a specific orientation or has construction and operation in a specific orientation, and therefore are not construed as limiting of the present disclosure. Furthermore, features defined by "first" and "second" may comprise one or more of the features explicitly or implicitly. In the descriptions of the present disclosure, "a plurality of" means two or more, unless otherwise stated.

In the descriptions of the present disclosure, it is noted that unless otherwise explicitly specified and defined, the terms "installation", "connection", and "couple" should be understood broadly, which may be fixed, detachable, or integrated, for example, may be mechanical or electrical, and may be directly connected or indirectly connected through an intermediate medium, or may be an internal communication of two components. The meaning of the above terms in the present disclosure can be understood by those skilled in the art according to actual situations.

At least one embodiment of the present disclosure provides an encapsulation structure of an organic electroluminescent device. The encapsulation structure of an organic electroluminescent device will be described below with reference to FIG. 1 to FIG. 4.

As illustrated in FIG. 1, an encapsulation structure 100 (for example, a TFE structure, that is, a thin film encapsulation structure) of an organic electroluminescent device provided by an embodiment of the present disclosure comprises a substrate 1, a first inorganic sealing layer 2, and an organic sealing layer 3.

The first inorganic sealing layer 2 is stacked with the substrate 1 and on a side of the substrate 1 (for example, an outer side in FIG. 1). The organic sealing layer 3 is stacked with the first inorganic sealing layer 2 and on a side of the first inorganic sealing layer 2 that is away from the substrate 1 (for example, an outer side in FIG. 1). For example, the substrate 1, the first inorganic sealing layer 2, and the organic sealing layer 3 are sequentially disposed in a direction from the inside to the outside.

Optionally, the first inorganic sealing layer 2 may comprise a SiNx layer, a SiON layer, or a SiOx layer. For example, the first inorganic sealing layer 2 can be prepared by a PECVD (Plasma Enhanced Chemical Vapor Deposition) process or an ALD (Atomic Layer Deposition) process. The process is simple, and the processing is convenient.

In some embodiments of the present disclosure, a thickness t1 of the first inorganic sealing layer 2 satisfies: 0.4 µm≤t1≤1.0 µm. For example, the thickness t1 of the first inorganic sealing layer 2 may satisfy: t1=0.4 µm, t1=0.5 µm, t1=0.8 µm, t1=1.0 µm, or the like. Therefore, the sealing performance of the encapsulation structure 100 can be improved and the overall thickness of the encapsulation structure 100 can be reduced.

In an embodiment of the present disclosure, the organic sealing layer 3 comprises a UV light absorbing material and/or a UV resistant polymer material. That is, a UV light absorbing material or a UV resistant polymer material may be added to the organic material of the organic sealing layer 3, alternatively, a UV light absorbing material and a UV resistant polymer material may be added to the organic material of the organic sealing layer 3. As such, the resistance ability of the encapsulation structure 100 to external ultraviolet light can be improved. Therefore the ultraviolet resistance ability of the organic electroluminescent device can be improved, and the denaturation risk of the OLED display panel caused by the radiation of ultraviolet light in sunlight can be reduced, thereby prolonging the lifetime of the OLED display panel.

Where the organic material of the organic sealing layer 3 comprises the UV light absorbing material, in the preparing process, the UV light absorbing material can be mixed with other materials in the organic sealing layer 3, and the organic sealing layer 3 is formed on the first inorganic sealing layer 2 by an inkjet printing technology. Where the organic material of the organic sealing layer 3 comprises the UV resistant polymer material, in the preparing process, the UV resistant polymer material can be mixed with other materials in the organic sealing layer 3, and the organic sealing layer 3 is formed on the inorganic sealing layer 2 by an inkjet printing technology, and then a crosslinked UV resistant structure is formed by heating or UV irradiation. Therefore, the resistance ability of the encapsulation structure 100 to external ultraviolet light can be effectively improved, and such a process is simple, and the processing is convenient.

In the encapsulation structure 100 of the organic electroluminescent device provided by the embodiments of the present disclosure, by adding at least one of a UV light absorbing material and a UV resistant polymer material to the organic material of the organic sealing layer 3, the resistance ability of the encapsulation structure 100 to the external ultraviolet light can be improved, and the denaturation risk of the OLED display panel caused by the radiation of ultraviolet light in sunlight can be reduced, thereby prolonging the lifetime of the OLED display panel. Moreover, in the preparing process, the UV light absorbing material or the UV resistant polymer material is simply mixed with other materials in the organic sealing layer 3 and then printed together with the other materials on the first inorganic sealing layer 2, and therefore the ultraviolet resistance ability of the encapsulation structure 100 is improved, and the encapsulation method is simplified as well. Such a process is simple, and the processing is convenient.

In an embodiment of the present disclosure, the UV light absorbing material may be at least one of a titan yellow pigment, a quinophthalone pigment, and a pyrazolone pigment. That is, the UV light absorbing material may be the titan yellow pigment, the quinophthalone pigment or the pyrazolone-based pigment. Alternatively, the UV light absorbing material may be a mixture of two of the titan yellow pigment, the quinacridone pigment, and the pyrazolone pigment. Alternatively, the UV light absorbing material may also be a mixture of the titan yellow pigment, the quinophthalone pigment, and the pyrazolone pigment. The titan yellow pigment, the quinophthalone pigment, and the pyrazolone pigment have strong UV resistance ability and strong stability, and are not easy to aggregate. Therefore, the ultraviolet resistance ability and the stability of the encapsulation structure 100 can be improved, and the reliability of the encapsulation structure 100 is improved.

In an embodiment of the present disclosure, a particle diameter d of the UV light absorbing material satisfies: 80 nm≤d≤400 nm. The UV light absorbing material may have a uniform particle diameter, or may comprise a plurality of different particle diameters. For example, in some embodiments of the present disclosure, the particle diameter of the UV light absorbing material may be 80 nm, 100 nm, 120 nm, 150 nm, 200 nm, 300 nm, 350 nm, or 400 nm. For another example, in other embodiments of the present disclosure, the UV light absorbing material comprises at least two different particle diameters. Therefore, the UV light absorbing material can resist ultraviolet light of different wavelength bands, and the ultraviolet resistance ability of the UV light absorbing material is effectively improved.

According to some embodiments of the present disclosure, the UV resistant polymer material comprises an acrylate prepolymer, a UV reactive monomer, a photoinitiator, a leveling agent, an ultraviolet absorber, and an organic solvent. The acrylate prepolymer, the UV reactive monomer, the photoinitiator, the leveling agent, the ultraviolet absorber, and the organic solvent are mixed with the organic material of the organic sealing layer 3, and the organic sealing layer 3 is formed on the inorganic sealing layer 2 by an inkjet printing technology, and then a crosslinked UV resistant structure is formed by heating or UV irradiation.

The acrylic prepolymer refers to a resin synthesized by several acrylic monomers which is further polymerized together with other monomers to form a polymer, and the acrylic prepolymer is sometimes named as an oligomer. The UV reactive monomer may be hydroxyethyl acrylate, hydroxypropyl acrylate, lauryl acrylate, stearyl acrylate, or the like. The photoinitiator, also known as a photosensitizer or a photocuring agent, is a type of compounds that can absorb energy at a certain wavelength in the ultraviolet region (from 250 nm to 420 nm) or in the visible region (from 400 nm to 800 nm), and generate radicals, cations, and so on, and therefore initiate the monomers to be polymerized, crosslinked and cured. The leveling agent is a commonly used coating additive that promotes the coating material to form a flat, smooth, and uniform coating film in a film drying process. The leveling agent is a kind of additives that can effectively reduce the surface tension of the coating liquid and improve the leveling property and uniformity of the coating liquid. The UV absorber is a light stabilizer that absorbs the ultraviolet light in sunlight and from fluorescent light sources without changing itself. The organic solvent may be ethanol, acetone, or the like.

In some embodiments of the present disclosure, the encapsulation structure 100 of the organic electroluminescent device may further comprise a second inorganic sealing layer 4, the second inorganic sealing layer 4 is stacked with the organic sealing layer 3 and on a side of the organic sealing layer 3 that is away from the substrate 1 (for example, an outer side in FIG. 1). Because the organic material of the organic sealing layer 3 comprises a material extremely sensitive to moisture and oxygen, disposing the second inorganic sealing layer 4 on the organic sealing layer 3 can effectively isolate the organic material from the external space, and thus block the moisture and oxygen in the air, thereby prolonging the lifetime of the organic electroluminescent device. For example, a sealing condition can be obtained as follows: water vapor being $10^{-6}$ g/day/m$^2$, and oxygen being $10^{-3}$ cm$^3$/day/m$^2$.

The second inorganic sealing layer 4 may comprise a SiNx layer, a SiON layer or a SiOx layer. For example, the second inorganic sealing layer 4 can be prepared by a PECVD (Plasma Enhanced Chemical Vapor Deposition) process or an ALD (Atomic Layer Deposition) process. The process is simple, and the processing is convenient.

In some embodiments of the present disclosure, a thickness t2 of the second inorganic sealing layer 4 satisfies: 0.4 μm≤t2≤1.0 μm. For example, the thickness t2 of the second inorganic sealing layer 4 may satisfy: t2=0.4 μm, t2=0.5 μm, t2=0.8 μm, t1=1.0 μm, or the like. Therefore, the sealing performance of the encapsulation structure 100 can be improved and the overall thickness of the encapsulation structure 100 can be reduced.

In some embodiments of the present disclosure, a thickness t3 of the organic sealing layer 3 may satisfy: 3 μm≤t3≤10 μm. For example, the thickness t3 of the organic sealing layer 3 may satisfy: t3=3 μm, t3=5 μm, t3=8 μm, t3=10 μm, or the like. Therefore, the sealing performance of the encapsulation structure 100 can be improved and the overall thickness of the encapsulation structure 100 can be reduced.

Other configurations and operations of the encapsulation structure 100 of the organic electroluminescent device according to the embodiments of the present disclosure can be understandable to those skilled in the art and are not described in detail here.

The encapsulation structure 100 of the organic electroluminescent device according to the embodiments of the present disclosure ensures blocking water and oxygen, and also absorbs or resists UV light within the solar spectrum, so as to achieve protection for the organic electroluminescent device.

At least one embodiment of the present disclosure provides an encapsulation method of an organic electroluminescent device.

Figure 2:
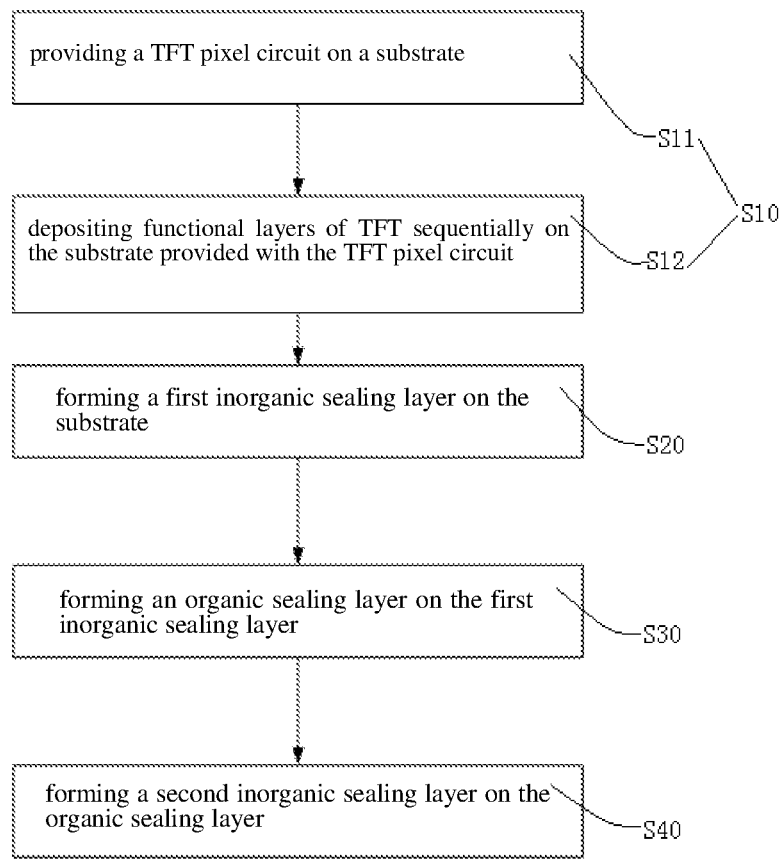
FIG. 2 is a flow diagram of an encapsulation method of an organic electroluminescent device provided by an embodiment of the present disclosure.

FIG. 2 illustrates an encapsulation method of an organic electroluminescent device according to an embodiment of the present disclosure. As illustrated in FIG. 2, the encapsulation method comprises:

S10: preparing a substrate 1;

S20: forming a first inorganic sealing layer 2 on the substrate 1; and

S30: forming an organic sealing layer 3 on the first inorganic sealing layer 2. The organic sealing layer 3 is made of an organic material comprising a UV light absorbing material and/or a UV resistant polymer material.

The step S10 may comprise:

S11: providing a TFT pixel circuit on the substrate 1; and

S12: depositing functional layers of the organic electroluminescent device sequentially on the substrate 1 provided with the TFT pixel circuit. The substrate 1 may be a flexible substrate PI (polyimide), and the functional layers may comprise a hole injection layer (HIL), a hole transport layer (HTL), a light emitting layer (EML), an electron transport layer (ETL), a cathode (CATHODE), or a light capping layer (CPL). The hole injection layer (HIL), the hole transport layer (HTL), the light emitting layer (EML), the electron transport layer (ETL), the cathode (CATHODE), and the light capping layer (CPL) are sequentially deposited on the substrate 1 provided with the TFT pixel circuit.

The first inorganic sealing layer 2 may comprise a SiNx layer, a SiON layer or a SiOx layer. For example, the first inorganic sealing layer 2 can be prepared by a PECVD (Plasma Enhanced Chemical Vapor Deposition) process or an ALD (Atomic Layer Deposition) process. The process is simple, and the processing is convenient. In some embodiments of the present disclosure, a thickness t1 of the first inorganic sealing layer 2 satisfies: $0.4\ \mu m \le t1 \le 1.0\ \mu m$. For example, the thickness t1 of the first inorganic sealing layer 2 may satisfy: $t1=0.4\ \mu m$, $t1=0.5\ \mu m$, $t1=0.8\ \mu m$, $t1=1.0\ \mu m$, or the like. Therefore, the sealing performance of the encapsulation structure 100 can be improved.

In the preparing process, the UV light absorbing material and/or the UV resistant polymer material can be mixed with other materials in the organic sealing layer 3, and then the mixed organic material forms the organic sealing layer 3 on the first inorganic sealing layer 2. That is, the UV light absorbing material or the UV resistant polymer material can be added to the organic material of the organic sealing layer 3, alternatively, the UV light absorbing material and the UV resistant polymer material can be added to the organic material of the organic sealing layer 3. Therefore, the resistance ability of the encapsulation structure 100 to external ultraviolet light can be effectively improved. Furthermore, the process is simple, and the processing is convenient.

In the encapsulation method of the organic electroluminescent device according to the embodiments of the present disclosure, by adding at least one of the UV light absorbing material and the UV resistant polymer material to the organic material of the organic sealing layer 3, the resistance ability of the encapsulation structure 100 of the organic electroluminescent device to external ultraviolet light can be improved, and thus the ultraviolet resistance ability of the organic electroluminescent device can be improved, and the denaturation risk of the OLED display panel caused by the radiation of ultraviolet light in sunlight can be reduced, thereby prolonging the lifetime of the OLED display panel. Moreover, in the preparing process, the UV light absorbing material and/or the UV resistant polymer material are simply mixed with other materials in the organic sealing layer 3, the ultraviolet resistance ability of the encapsulation structure 100 is improved, and the encapsulation method is simplified as well. The process is simple, and the processing is convenient.

In some embodiments of the present disclosure, where the UV light absorbing material is added to the organic material, the step S30 comprises:

S31*a*: forming the organic sealing layer 3 on the first inorganic sealing layer 2 by an inkjet printing technique.

Figure 3:
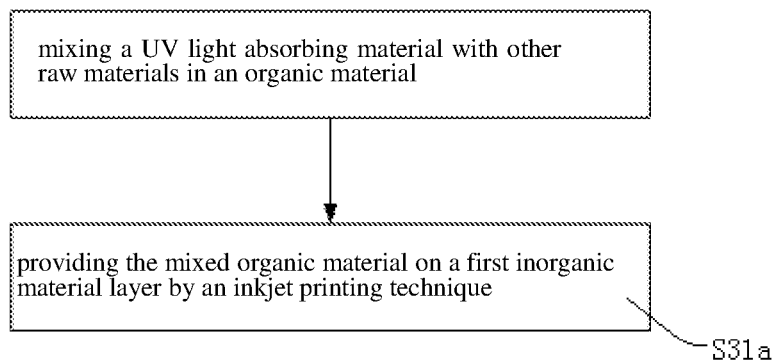
FIG. 3 is a flow diagram of a preparation method of an organic layer provided by an embodiment of the present disclosure.

Referring to FIG. 3, in the preparing process of some embodiments of the present disclosure, the UV light absorbing material can be mixed with other materials in the organic sealing layer 3, and then the organic sealing layer 3 is formed on the first inorganic sealing layer 2 by an inkjet printing technique. Therefore, the resistance ability of the encapsulation structure 100 to external ultraviolet light can be effectively improved. The process is simple, and the processing is convenient.

In some embodiments of the present disclosure, where the UV resistant polymer material is added to the organic material, the step S30 comprise:

S31*b*: forming an organic sealing layer 3 on the first inorganic sealing layer 2 by an inkjet printing technique; and S32*b*: allowing the UV resistant polymer material to form a crosslinked UV resistant structure.

Figure 4:
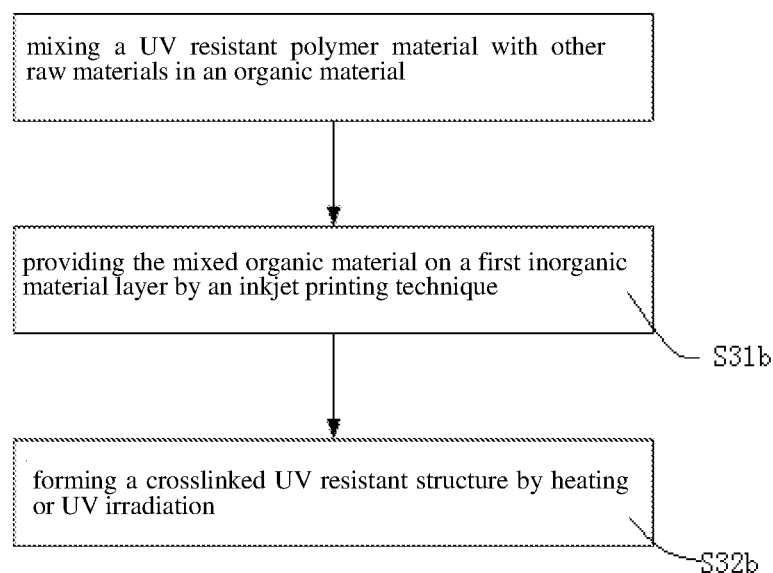
FIG. 4 is a flow diagram of a preparation method of an organic layer provided by another embodiment of the present disclosure.

Referring to FIG. 4, in the preparing process of some embodiments of the present disclosure, after forming the organic sealing layer 3 on the first inorganic sealing layer 2 by an inkjet printing technology, the UV resistant polymer material is allowed to form a crosslinked UV resistant structure by heating or UV irradiation. Therefore, the resistance ability of the encapsulation structure 100 to external ultraviolet light can be effectively improved. The process is simple, and the processing is convenient.

The UV light absorbing material is a blue light absorbing pigment. Therefore, the ultraviolet light absorbing ability of the UV light absorbing material can be ensured. For example, the UV light absorbing material may comprise at least one of a titan yellow pigment, a quinophthalone pigment, and a pyrazolone pigment. That is, the UV light absorbing material may be the titan yellow pigment, the quinophthalone pigment or the pyrazolone pigment. Alternatively, the UV light absorbing material may be a mixture of two of the titan yellow pigment, the quinacridone pigment, and the pyrazolone pigment. Alternatively, the UV light absorbing material may be a mixture of the titan yellow pigment, the quinacridone pigment and the pyrazolone pigment. The titan yellow pigment, the quinacridone pigment, and the pyrazolone pigment have strong UV resistance ability and strong stability, and are not easy to aggregate. Therefore, the ultraviolet resistance ability and stability of the encapsulation structure 100 can be improved, and therefore the reliability of the encapsulation structure 100 is improved. It is understood that the UV light absorbing material may be any other blue light absorbing pigments.

In some embodiments of the present disclosure, a particle diameter d of the UV light absorbing material satisfies: $80\ nm \le d \le 400\ nm$. The UV light absorbing material may have a uniform particle diameter, or may comprise a plurality of different particle diameters. For example, in some embodiments of the present disclosure, the UV light absorbing material has a particle diameter of 80 nm, 100 nm, 120 nm, 150 nm, 200 nm, 300 nm, 350 nm, or 400 nm. For another example, in some embodiments of the present disclosure, the UV light absorbing material comprises at least two different particle diameters. Therefore, the UV light absorbing material can resist ultraviolet light of different wavelength bands, and the ultraviolet resistance ability of the UV light absorbing material is effectively improved.

In some embodiments of the present disclosure, the UV resistant polymer material comprises an acrylate prepolymer, a UV reactive monomer, a photoinitiator, a leveling agent, an ultraviolet absorber, and an organic solvent.

In some embodiments of the present disclosure, the UV resistant polymer material comprises an acrylate prepolymer, a UV reactive monomer, a photoinitiator, a leveling agent, an ultraviolet absorber, and an organic solvent. After the acrylate prepolymer, the UV reactive monomer, the photoinitiator, the leveling agent, the ultraviolet absorber, and the organic solvent are mixed with the organic material of the organic sealing layer 3, the organic sealing layer 3 is formed on the inorganic sealing layer 2 by an inkjet printing technology, and then a crosslinked UV resistant structure is formed by heating or UV irradiation.

The acrylic prepolymer refers to a resin synthesized by several acrylic monomers which is further polymerized together with other monomers to form a polymer, and the acrylic prepolymer is sometimes named as an oligomer. The UV reactive monomer may be hydroxyethyl acrylate, hydroxypropyl acrylate, lauryl acrylate, stearyl acrylate, or the like. The photoinitiator, also known as a photosensitizer or a photocuring agent, is a type of compounds that can absorb energy at a certain wavelength in the ultraviolet region (from 250 nm to 420 nm) or in the visible region (from 400 nm to 800 nm), and generate radicals, cations, and so on, and therefore initiate the monomers to be polymerized, crosslinked and cured. The leveling agent is a commonly used coating additive that promotes the coating material to form a flat, smooth, and uniform coating film in a film drying process. The leveling agent is a kind of additives that can effectively reduce the surface tension of the coating liquid and improve the leveling property and uniformity of the coating liquid. The UV absorber is a light stabilizer that absorbs the ultraviolet light in sunlight and from fluorescent light sources without changing itself. The organic solvent may be ethanol, acetone, or the like.

In some embodiments of the present disclosure, the encapsulation method further comprises: step S40: forming a second inorganic sealing layer 4 on the organic sealing layer 3. The second inorganic sealing layer 4 may comprise a SiNx layer, a SiON layer or a SiOx layer. For example, the second inorganic sealing layer 4 can be prepared by a PECVD (Plasma Enhanced Chemical Vapor Deposition) process or an ALD (Atomic Layer Deposition) process. The process is simple, and the processing is convenient.

In some embodiments of the present disclosure, a thickness t2 of the second inorganic sealing layer 4 satisfies: 0.4 µm≤t2≤1.0 µm. For example, the thickness t2 of the second inorganic sealing layer 4 may satisfy: t2=0.4 µm, t2=0.5 µm, t2=0.8 µm, t1=1.0 µm, or the like. Therefore, the sealing performance of the encapsulation structure 100 can be improved and the overall thickness of the encapsulation structure 100 can be reduced.

According to some embodiments of the present disclosure, a thickness t3 of the organic sealing layer 3 may satisfy: 3 µm≤t3≤10 µm. For example, the thickness t3 of the organic sealing layer 3 may satisfy: t3=3 µm, t3=5 µm, t3=8 µm, t3=10 µm, or the like. Therefore, the sealing performance of the encapsulation structure 100 can be improved and the overall thickness of the encapsulation structure 100 can be reduced.

At least one embodiment of the present disclosure provides a display panel, which comprises the above encapsulation structure 100 of the organic electroluminescent device.

In the display panel according to the embodiments of the present disclosure, by providing the encapsulation structure 100 of the organic electroluminescent device according to the embodiments of the present disclosure, the ultraviolet resistance ability of the encapsulation structure 100 is improved, and the lifetime of the display panel is prolonged.

At least one embodiment of the present disclosure provides a display panel comprising an encapsulation structure of an organic electroluminescent device, which is formed by the encapsulation method according to an embodiment of the present disclosure.

In the display panel according to the embodiments of the present disclosure, by providing the encapsulation structure formed by the encapsulation method according to the embodiments of the present disclosure, the ultraviolet resistance ability of the organic electroluminescent device is improved, and the lifetime of the display panel is prolonged.

The above descriptions only relate to exemplary embodiments of the present disclosure, and are not intended to limit the protection scope of the disclosure. The protection scope of the present disclosure is determined by the appended claims.

What is claimed is:

1. An organic electroluminescent device, comprising:
    a substrate;
    a TFT pixel circuit on the substrate;
    functional layers of the organic electroluminescent device sequentially on the substrate;
    a first inorganic sealing layer stacked on the substrate; and
    an organic sealing layer stacked on a side of the first inorganic sealing layer that is away from the substrate and directly contacts with the first inorganic sealing layer, wherein the organic sealing layer comprises (i) a UV light absorbing material comprising at least two different particle diameters and (ii) a UV resistant polymer material comprising a crosslinked UV resistant structure;
    a second inorganic sealing layer stacked on a side of the organic sealing layer that is away from the substrate and directly contacts with the organic sealing layer;
    wherein the first inorganic sealing layer, the organic sealing layer and the second inorganic sealing layer form a film encapsulation structure of the organic electroluminescent device;
    water vapor sealing condition of the film encapsulation structure is $10^{-6}$ g/day/m$^2$, and oxygen sealing condition of the film encapsulation structure is $10^{-3}$ cm$^3$/day/m$^2$;
    wherein the UV light absorbing material comprises at least one of a titan yellow pigment, a quinophthalone pigment, and a pyrazolone pigment;
    the UV light absorbing material has a particle diameter d which satisfies 80 nm≤d≤400 nm.

2. The encapsulation structure according to claim 1, wherein the UV resistant polymer material comprises an acrylate prepolymer, a UV reactive monomer, a photoinitiator, a leveling agent, an ultraviolet absorber, and an organic solvent.

3. An encapsulation method of an organic electroluminescent device, comprising:
    preparing a substrate;
    providing a TFT pixel circuit on the substrate; and
    depositing functional layers of the organic electroluminescent device sequentially on the substrate provided with the TFT pixel circuit;
    forming a first inorganic sealing layer on the substrate; and
    forming an organic sealing layer on the first inorganic sealing layer, wherein the organic sealing layer is made of an organic material comprising (i) a UV light absorbing material comprising at least two different particle diameters and (ii) a UV resistant polymer material comprising a crosslinked UV resistant structure;
    forming a second inorganic sealing layer stacked on a side of the organic sealing layer that is away from the substrate and directly contacts with the organic sealing layer;
    wherein the first inorganic sealing layer, the organic sealing layer and the second inorganic sealing layer form a film encapsulation structure of the organic electroluminescent device;

water vapor sealing condition of the film encapsulation structure is $10^{-6}$ g/day/m$^2$, and oxygen sealing condition of the film encapsulation structure is $10^{-3}$ cm$^3$/day/m$^2$;

wherein the UV light absorbing material comprises at least one of a titan yellow pigment, a quinophthalone pigment, and a pyrazolone pigment;

the UV light absorbing material has a particle diameter d which satisfies 80 nm≤d≤400 nm.

4. The encapsulation method according to claim 3, wherein the forming the organic sealing layer on the first inorganic sealing layer comprises:

forming the organic sealing layer on the first inorganic sealing layer by an inkjet printing technique.

5. The encapsulation method according to claim 3, wherein the forming the organic sealing layer on the first inorganic sealing layer comprises:

forming the organic sealing layer on the first inorganic sealing layer by an inkjet printing technique; and allowing the UV resistant polymer material to form a crosslinked UV resistant structure.

6. The encapsulation method according to claim 5, wherein the UV resistant polymer material is allowed to form the crosslinked UV resistant structure by heating or UV irradiation.

7. The encapsulation method according to claim 3, wherein the UV resistant polymer material comprises an acrylate prepolymer, a UV reactive monomer, a photoinitiator, a leveling agent, an ultraviolet absorber, and an organic solvent.

* * * * *